(12) United States Patent
Lin et al.

(10) Patent No.: US 8,198,684 B2
(45) Date of Patent: Jun. 12, 2012

(54) SEMICONDUCTOR DEVICE WITH DRAIN VOLTAGE PROTECTION FOR ESD

(75) Inventors: Wei-Chieh Lin, Hsinchu (TW);
Guo-Liang Yang, Hsinchu (TW);
Jen-Hao Yeh, Kaohsiung County (TW);
Jia-Fu Lin, Yilan County (TW)

(73) Assignee: Anpec Electronics Corporation,
Hsinchu Science Park, Hsin-Chu (TW)

( * ) Notice: Subject to any disclaimer, the term of this patent is extended or adjusted under 35 U.S.C. 154(b) by 285 days.

(21) Appl. No.: 12/614,434

(22) Filed: Nov. 8, 2009

(65) Prior Publication Data
US 2011/0084335 A1 Apr. 14, 2011

(30) Foreign Application Priority Data
Oct. 8, 2009 (TW) ................. 98134095 A (51) Int. Cl.
*H01L 23/62* (2006.01)
(52) U.S. Cl. ........ 257/355; 257/329; 257/330; 257/328; 257/E21.355
(58) Field of Classification Search .................. 257/328, 257/356
See application file for complete search history.

(56) References Cited

U.S. PATENT DOCUMENTS
2001/0009287 A1 * 7/2001 Fujihira et al. ................ 257/328

FOREIGN PATENT DOCUMENTS
JP 07-273320 * 10/1995

OTHER PUBLICATIONS
Machine translation of JP07-273320.*

* cited by examiner

*Primary Examiner* — Marcos D. Pizarro
*Assistant Examiner* — Eva Yan Montalvo
(74) *Attorney, Agent, or Firm* — Winston Hsu; Scott Margo (57) ABSTRACT

A power semiconductor device with drain voltage protection includes a semiconductor substrate, at least a trench gate transistor device and at least a trench ESD protection device. An upper surface of the semiconductor substrate has a first trench and a second trench. The trench gate transistor device is disposed in the first trench and the semiconductor substrate. The trench ESD protection device is disposed in the second trench, and includes a first doped region, a second doped region and a third doped region. The first doped region and the third doped region are respectively electrically connected to a drain and a gate of the trench gate transistor device.

11 Claims, 11 Drawing Sheets

SEMICONDUCTOR DEVICE WITH DRAIN VOLTAGE PROTECTION FOR ESD

BACKGROUND OF THE INVENTION

1. Field of the Invention

The present invention relates to a power semiconductor device and a manufacturing method thereof; more particularly, to a power semiconductor device with drain voltage protection and a manufacturing method thereof.

2. Description of the Prior Art

Due to that a power MOS (metal oxide semiconductor) transistor device has a conductivity of high voltage and high current, it tends to be damaged by an ESD pulse. In addition, in order to have a lower threshold voltage, a gate oxide layer of the power MOS transistor should be thinned in recently integrated circuits. To meet the requirement, the power MOS transistor may be easily damaged by an ESD pulse caused by friction or other reasons which are not in control. Therefore, in the application of the power MOS transistor, the power MOS transistor is necessary to be combined with an ESD protection circuit so as to prevent the power MOS transistor from being damaged. In the modern technique of manufacturing the power MOS transistor, the fabrication of the ESD protection circuit is generally performed after the fabrication of the power MOS transistor, which leads to additional manufacturing processes and costs.

Figure 1:
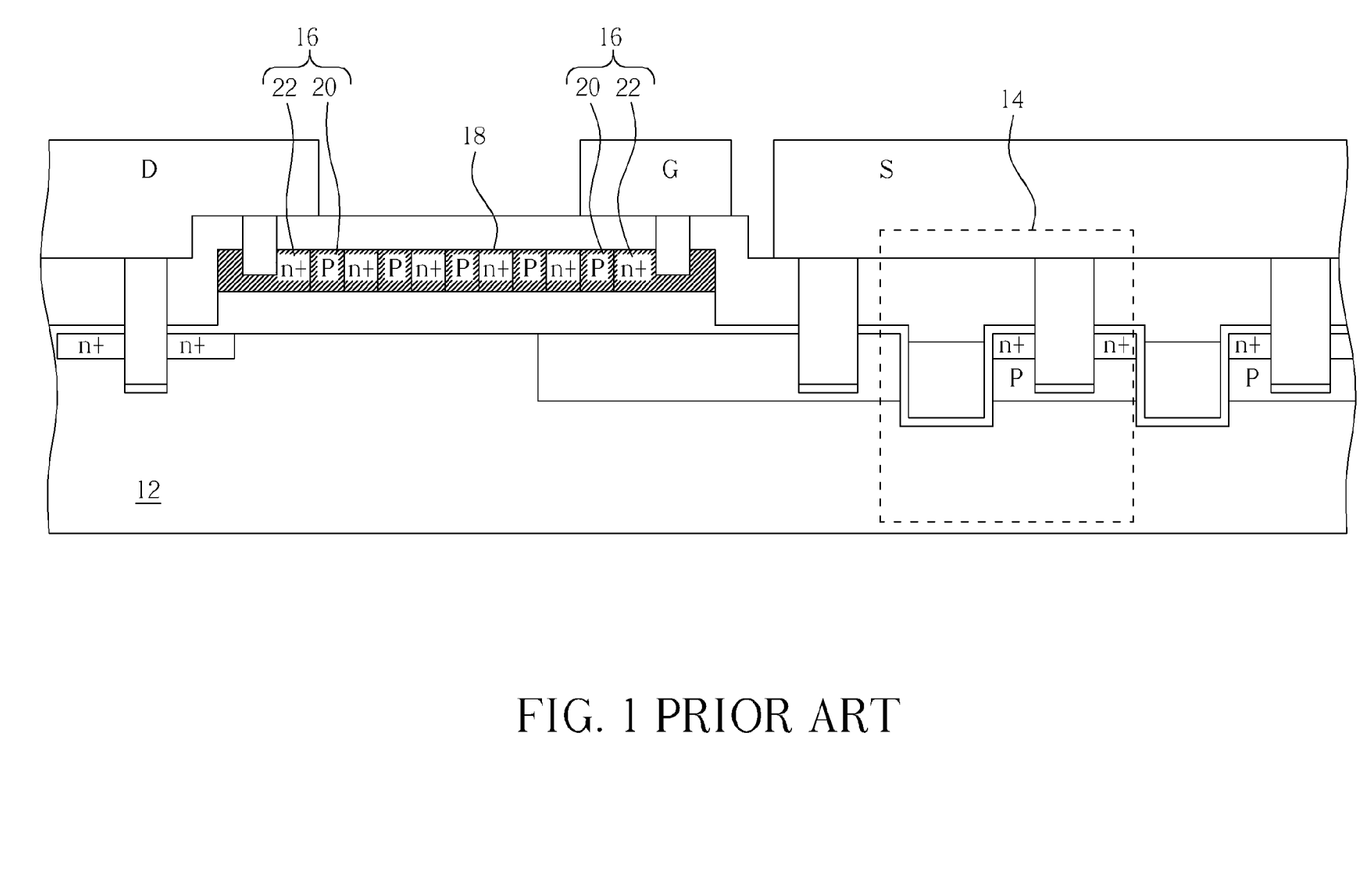
FIG. 1 is a cross-sectional schematic diagram showing a conventional trench semiconductor device.

FIG. 1 is a cross-sectional schematic diagram of a conventional power semiconductor device. As shown in FIG. 1, the conventional power semiconductor device 10 is formed on a semiconductor substrate 12, including a plurality of trench gate transistor devices 14 and a plurality of ESD protection devices 16. The method of forming the ESD protection devices 16 is described in the following description. A polysilicon layer 18 is formed first. Then, a P-type ion implantation process and an N-type ion implantation process are performed in sequence on the polysilicon layer 18 to form a plurality of P-type doped regions 20 and a plurality of N-type doped regions 22 in turn. The P-type doped regions 20 and the N-type doped regions 22 are alternately connected to each other, wherein any one of the P-type doped regions 20 and its adjacent N-type doped regions 22 form an ESD protection device 16 having a PN junction. The ESD protection devices 16 are connected in series between the gate and the drain of the trench gate transistor device.

However, an additional photomask to define the pattern of the polysilicon layer is required to integrate the ESD protection device into the trench gate transistor device for fabricating the power semiconductor device so that manufacturing processes are more complicated and costs are increased.

SUMMARY OF THE INVENTION

It is a primary objective of the present invention to provide a power semiconductor device with drain voltage protection and a manufacturing method thereof to solve the above-mentioned problems of complicated manufacturing processes and high costs.

In accordance with an embodiment of the present invention, a method for manufacturing a power semiconductor device with drain voltage protection is provided. The method includes the following steps. First, a semiconductor substrate with a first conductive type is provided, and a drain connection region, a first device region, and a second device region disposed between the drain connection region and the first device region are defined on the semiconductor substrate. At least a first trench is disposed on an upper surface of the semiconductor substrate of the first device region and a second trench is disposed on the upper surface of the semiconductor substrate of the second device region. It is followed by forming a first insulating layer on surfaces of the first trench and the second trench. A gate conductive layer is formed in the first trench and a first doped region is formed in the second trench. Next, a second doped region and a third doped region are both formed in the first doped, wherein the first doped region, the second doped region, and the third doped region form a trench ESD protection device, and the first doped region is disposed between the second doped region and the third doped region. A second insulating layer is later disposed over the semiconductor substrate and a source metal layer, a gate metal layer, and a drain connection electrode are formed on the second insulating layer, wherein the second doped region is electrically connected to the drain connection electrode, the third doped region is electrically connected to the gate metal layer, and the gate metal layer is electrically connected to the gate conductive layer.

Moreover, the present invention also provides a power semiconductor device with drain voltage protection. The power semiconductor device includes a semiconductor substrate, at least a trench gate transistor device, a trench ESD protection device, a source metal layer, a gate metal layer, and a drain metal layer. The semiconductor substrate has a first conductive type and is defined with a first device region and a second device region. An upper surface of the semiconductor substrate contains a first trench and a second trench, wherein the first trench is disposed in the first device region and the second trench is disposed in the second device region. The trench gate transistor device is formed in the first device region, and the trench gate transistor device includes a first insulating layer disposed on a surface of the first trench, a gate conductive layer disposed in the first trench, a doped base region disposed in the semiconductor substrate at a side of the first trench, and a source doped region disposed on the doped base region of the first device region. The doped base region has the first conductive type and the source doped region has a second conductive type and is electrically connected to the doped base region. The trench ESD protection device is disposed in the second device region of the second trench, and the trench ESD protection device contains a first doped region, a second doped region, and a third doped region, wherein the first doped region is disposed between the second doped region and the third doped region. The second doped region is electrically connected to the drain metal layer and the third doped region is electrically connected to the gate metal layer. The source metal layer is formed on the upper surface of the semiconductor substrate and electrically connected to the source doped region. The gate metal layer is formed on the upper surface of the semiconductor substrate and electrically connected to the gate conductive layer. The drain metal layer is disposed on a lower surface of the semiconductor substrate.

In the present invention, the manufacturing process of the trench ESD protection device is integrated into the manufacturing process of the trench gate transistor device; therefore, an additional photomask to define the doped region of the trench ESD protection device is no longer required. As a result, advantages of process simplification and cost reduction are able to be achieved. Furthermore, the present invention provides a power semiconductor device with drain voltage protection including a trench gate transistor device and a trench ESD protection device, and the trench ESD protection device is electrically connected between a source and a drain of the trench gate transistor device so as to provide a superior ability in ESD protection.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
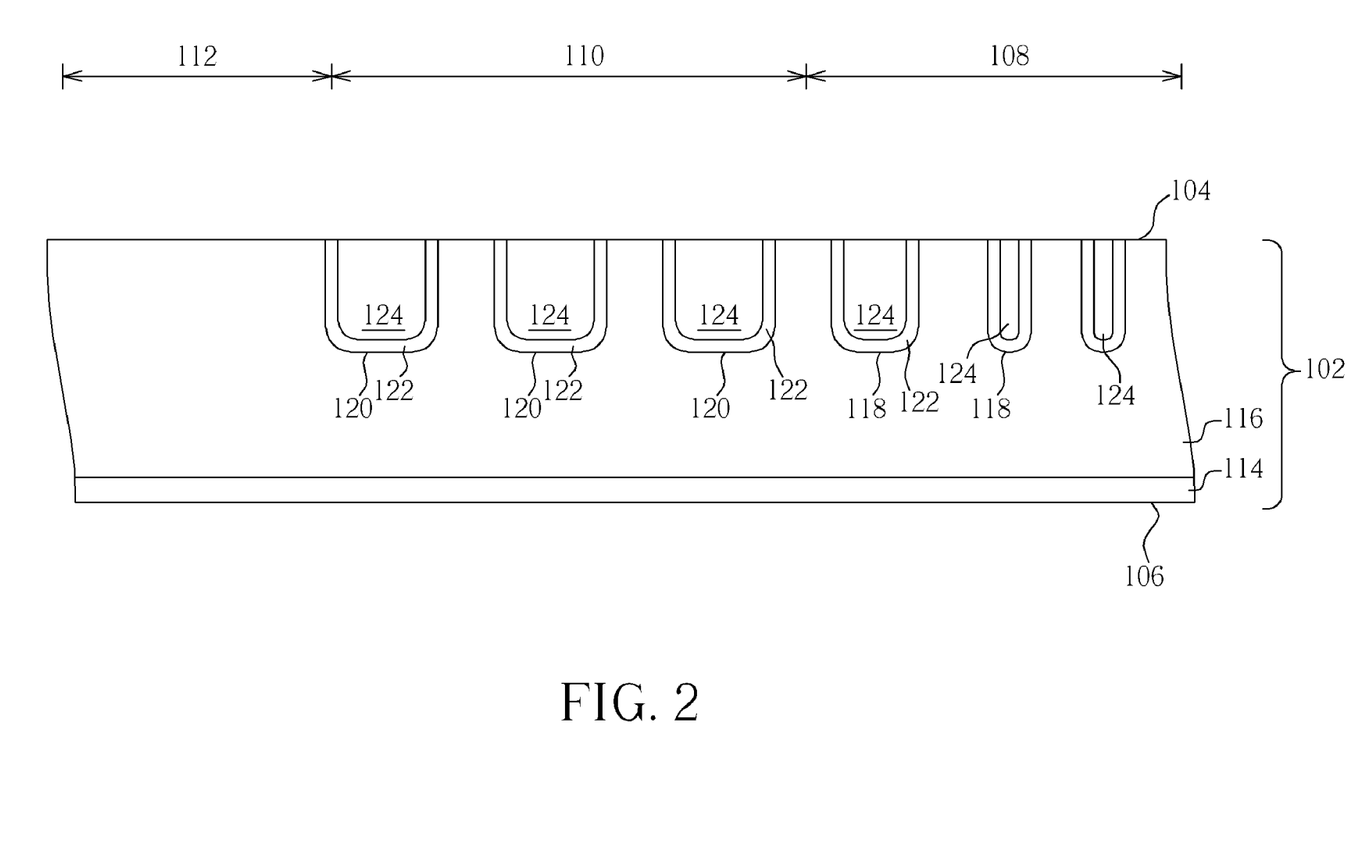
FIGS. 2 to 6 are schematic diagrams showing a method for manufacturing a trench semiconductor device according to a first embodiment of the present invention.

FIGS. 2 to 6 are schematic diagrams showing a manufacturing method of a trench semiconductor device according to a first embodiment of the present invention. As shown in FIG. 2, a semiconductor substrate 102 is provided. The semiconductor substrate 102 has an upper surface 104 and a lower surface 106 opposing to the upper surface 104, and a first device region 108, a second device region 110, and a drain connection region 112 are defined on the semiconductor substrate 102. The first device region 108 is used to form a trench gate transistor device, and the second device region 110 is used to form a trench ESD protection device. Additionally, the semiconductor substrate 102 includes a substrate 114 and an epitaxy layer 116 disposed on the substrate 114. The substrate 114 can be made of a silicon substrate, and both the substrate 114 and the epitaxy layer 116 have a first conductive type. Further, a photolithography and etching process is performed with a first photomask to form a plurality of first trenches 118 and a plurality of second trenches 120 on the upper surface 104 of the semiconductor substrate 102. Each of the first trenches 118 is disposed in the first device region 108, and each of the second trenches 120 is disposed in the second device region 110. Next, a first insulating layer 122 is formed on surfaces of each of the first trenches 118 and each of the second trenches 120. A plurality of undoped semiconductor layers 124, such as an undoped polysilicon material, are formed in each of the first trenches 118 and each of the second trenches 120 respectively.

Figure 3:
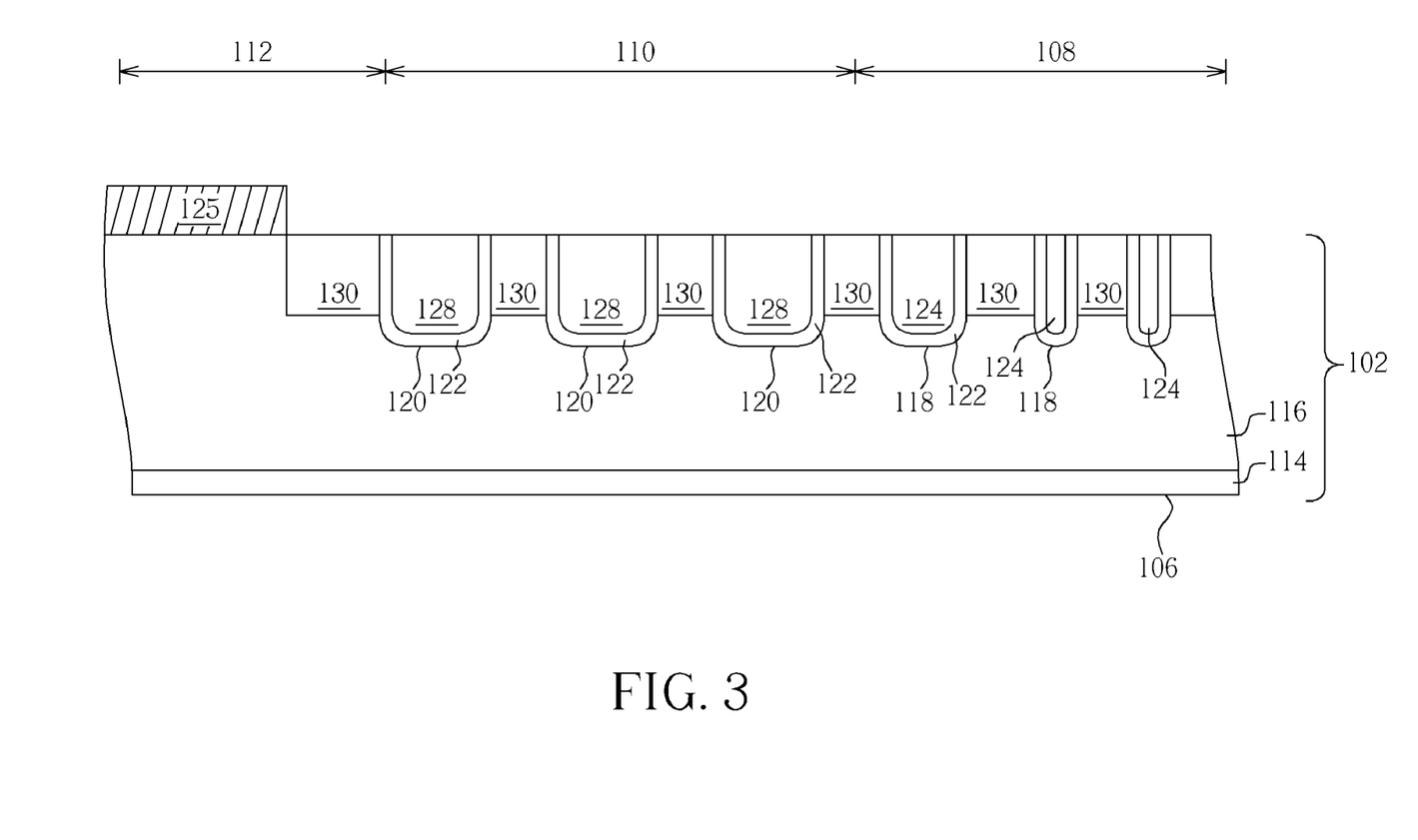

As shown in FIG. 3, the semiconductor substrate 102 in the drain connection region 112 is covered by a mask 125 and a first ion implantation process of a second conductive type is performed to implant the ions into the upper surface 104 of the semiconductor substrate 102 and into the undoped semiconductor layers 124. In the present embodiment, the mask 125 is removed after performing a first ion implantation process, and it is followed by a first drive-in process so that the ions implanted into the undoped semiconductor layers 124 in the first device region 108 and the second device region 110 can be diffused to respectively form a plurality of gate conductive layers 126 and a plurality of first doped regions 128 that have the second conductive type. Each of the gate conductive layers 126 serves as the gate of the trench gate transistor device. The first drive-in process also helps the ions implanted into the semiconductor substrate 102 at two sides of each of the first trenches 118 and at two sides of each of the second trenches 120 diffuse and form a plurality of doped base regions 130 with the second conductive type to serve as a channel of the trench gate transistor device. Moreover, in this embodiment, the first conductive type is an N type, and the second conductive type is a P type. However, the present invention is not limited to this, and the first conductive type and the second conductive type are interchangeable.

Figure 4:
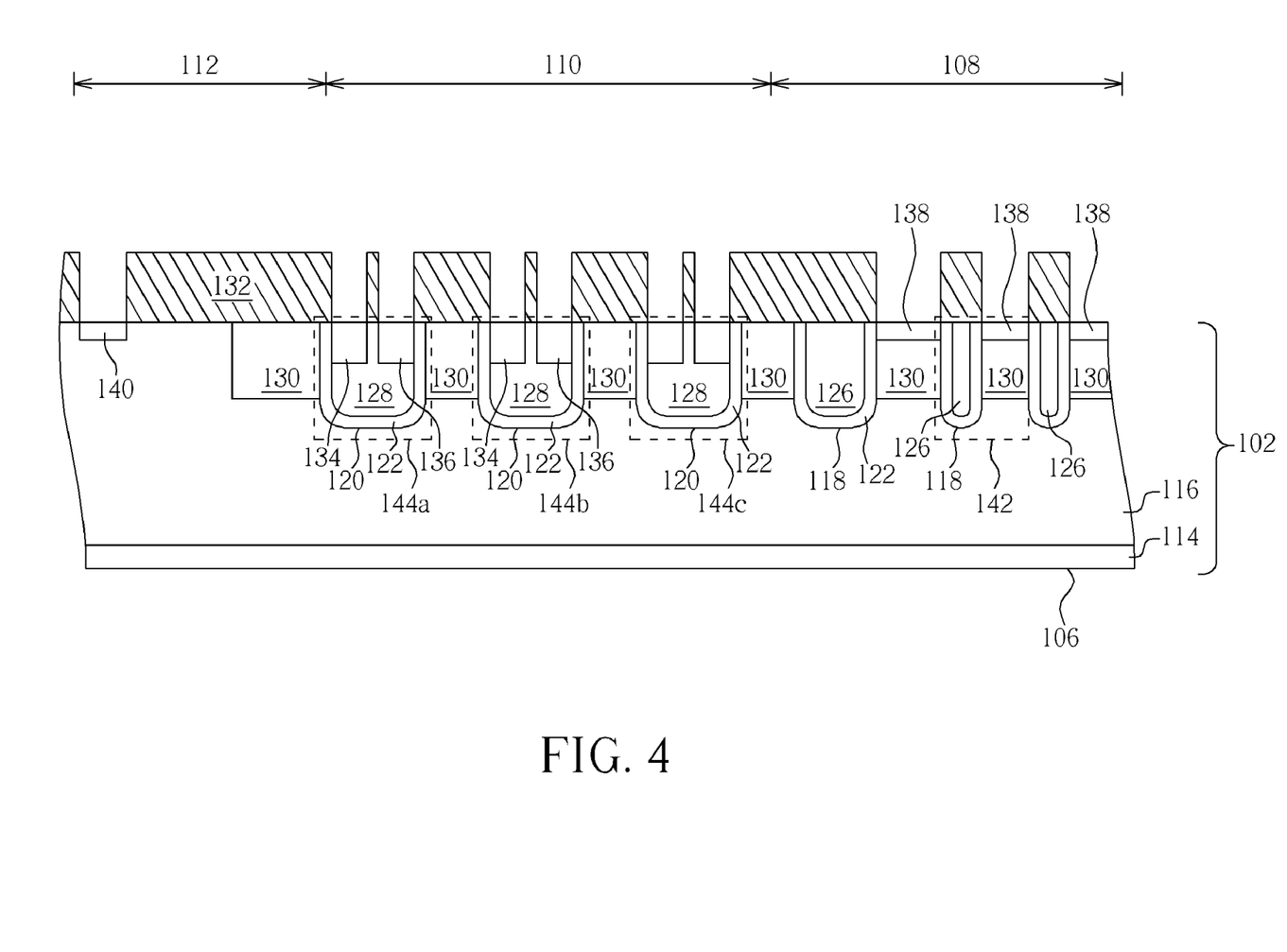

Afterward, as shown in FIG. 4, a photolithography and etching process is performed with a second photomask to form a mask pattern 132, such as a photoresist pattern, on the upper surface 104 of the N-type semiconductor substrate 102 so that the mask pattern 132 covers the N-type semiconductor substrate 102. A part of each of the P-type first doped regions 128, a part of the N-type semiconductor substrate 102 in the drain connection region 112, and each of the P-type doped base regions 130 in the first device region 108 are exposed from the mask pattern 132. It is followed by performing an N-type second ion implantation process to implant N-type heavily-doped ions into each of the exposed P-type doped base regions 130, each of the exposed P-type first doped regions 128, and the exposed N-type semiconductor substrate 102 in the drain connection region 112. Next, a second drive-in process is performed after removing the mask pattern 132, and an N-type second doped region 134 and an N-type third doped region 136 are respectively formed in each of the P-type first doped regions 128. An N-type source doped region 138 is disposed in each of the P-type doped base regions 130 in the first device region 108, and an N-type drain doped region 140 is disposed in the N-type semiconductor substrate 102 in the drain connection region 112.

Additionally, the N-type second doped regions 134 and the N-type third doped regions 136 of the present invention can be formed separately from the N-type source doped regions 138 and the N-type drain doped regions 140 in sequence so as to form doped regions with different depths. For example, the N-type second doped regions 134 and the N-type third doped region 136 are covered first, and then, an ion implantation process is performed on the N-type source doped regions 138 and the N-type drain doped regions 140. Next, the N-type source doped regions 138 and the N-type drain doped regions 140 are covered, and an ion implantation process is performed on the N-type second doped regions 134 and the N-type third doped regions 136; or else, vice versa. In this embodiment, each of the N-type source doped regions 138, the first insulating layers 122, each of the gate conductive layers 126, each of the P-type doped base regions 130, each of the N-type source doped regions 138, and the N-type semiconductor substrate 102 form an N-type metal-oxide-semiconductor transistor device 142 to serve as a trench gate transistor device 142 of the present invention. Moreover, the present invention is not limited that the abovementioned process requires performing a drive-in process after a P-type ion implantation process. Otherwise, the drive-in process after the P-type ion implantation process may be integrated into that after the N-type ion implantation process. As a result, the P-type ions can be diffused and implanted into the N-type semiconductor substrate 102 and each of the undoped semiconductor layers 124, and the N-type ions can be diffused and implanted into each of the P-type doped base regions 130, each of the first P-type doped regions 128, and the N-type semiconductor substrate 102 in the drain connection region 112.

It is to be noted that each of the P-type first doped regions 128, the corresponding N-type second doped region 134, and the corresponding N-type third doped region 136 form an NPN bidirectional diode device, and serve as trench ESD protection devices 144a, 144b, and 144c of this embodiment. Each of the N-type second doped regions 134 and the corresponding N-type third doped region 136 are disposed on the corresponding P-type first doped region 128, and a part of the corresponding P-type first doped region 128 is also disposed between the N-type second doped region 134 and the N-type third doped region 136. That is, in each of the trench ESD protection devices 144a, 144b, and 144c, a PN junction diode device, such as a Zener diode, is formed by each of the P-type first doped regions 128 and the corresponding N-type second doped region 134, and another diode device with PN junction is formed by the P-type first doped region 128 and the corresponding N-type third doped regions 136. Due to that a P junction between the two diode devices belongs to the same doped region, each of the trench ESD protection devices 144a, 144b, and 144c are able to provide two ends thereof to be in the off-states for the NMOS transistor device 142 of this embodiment. Accordingly, the trench ESD protection devices 144a, 144b, 144c of the present invention are connected in series between the gate and drain of the trench gate transistor device 142 so as to effectively prevent the operation of the trench gate transistor device 142 from being affected by the gate and the drain being in the on-state while the trench gate transistor device 142 is functioning. Moreover, to protect the gate and the drain of the trench gate transistor device 142, the turn-on voltage and turn-on current of the trench ESD protection devices 144a, 144b, and 144c being serially connected to each other are required to be smaller than the electrostatic voltage and current that the gate and drain of the trench gate transistor device 142 are able to tolerate. Alternatively, the number of the trench ESD protection devices being serially connected to each other is determined according to the electrostatic voltage and current that the gate and drain of the trench gate transistor device 142 require tolerating.

What is more, the mask pattern 132 of the present invention is not limited to covering the gate conductive layers 126. The mask pattern 132 may also expose the gate conductive layers 126, so that the N-type ion implantation process and the drive-in process can be performed to transform the P type of the gate conductive layers 126 into the N type. Therefore, whether to expose the gate conductive layers 126 from the mask pattern 132 or not depends on the desired conductive type of the gate conductive layers 126.

Figure 5:
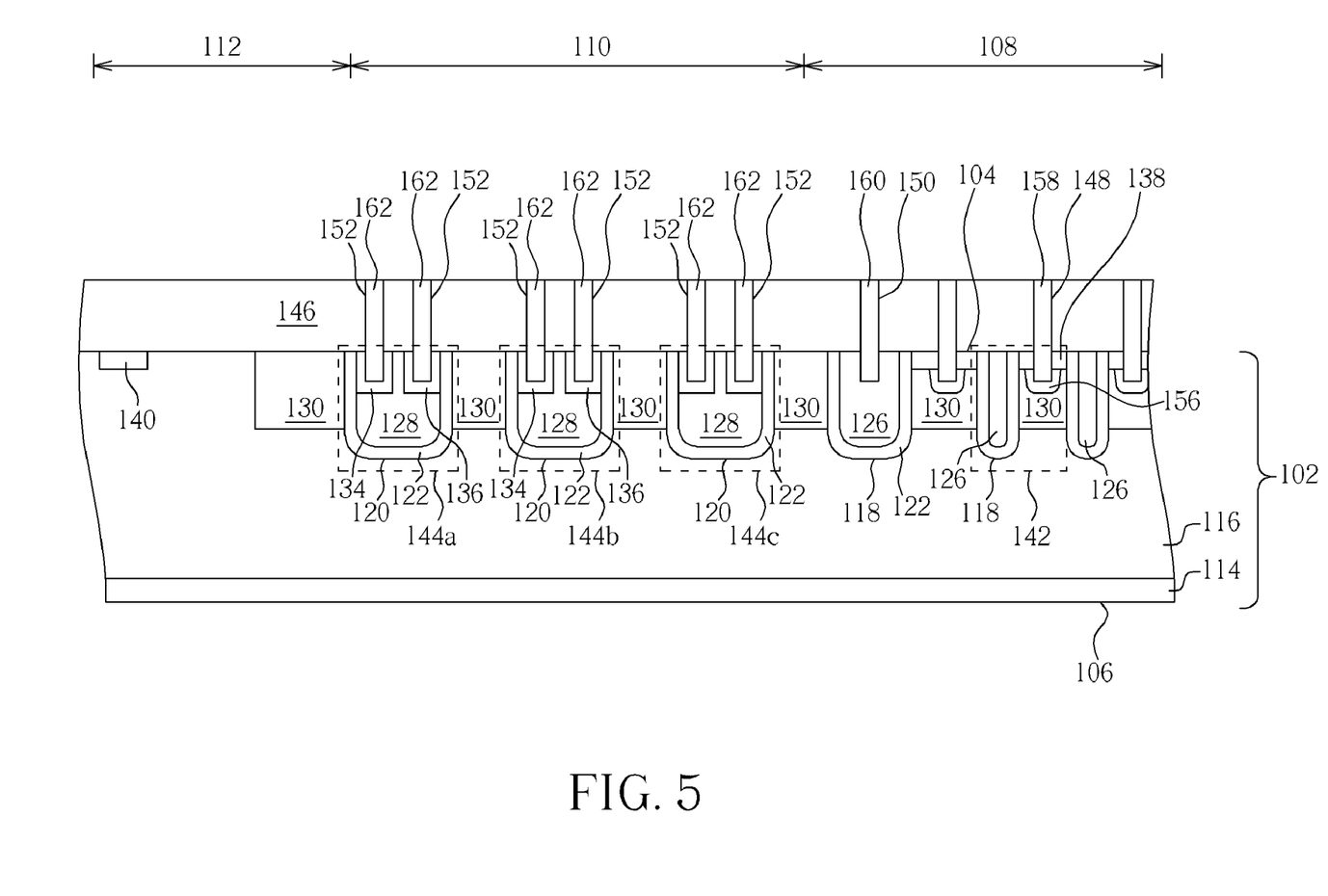

As shown in FIG. 5, a second insulating layer 146 is formed over the upper surface 104 of the N-type semiconductor substrate 102 by a deposition process. The second insulating layer 146 is a dielectric layer made of BPSG or other materials. Next, a photolithography and etching process is performed with a third photomask to form a plurality of source contact holes 148 and a gate connection hole 150 in the second insulating layer 146 of the first device region 108. Thus, each of the P-type doped base regions 130 can be exposed from the source contact holes 148, and at the same time, a plurality of connection contact holes 152 are formed in the second insulating layer 146 of the second device region 110. Subsequently, a plurality of P-type source contact doped regions 156 are selectively formed in the exposed P-type doped base regions 130 by performing a P-type ion implantation process with a mask. It is followed by forming a source contact plug 158 in each of the source contact holes 148, forming a gate contact plug 160 in the gate connection hole 150, and forming a contact plug 162 in each of the connection contact holes 152 simultaneously by a deposition process and an etch-back process. In this embodiment, the source contact plug 158 penetrates through the second insulating layer 146 and each of the N-type source doped regions 138 to be electrically connected to the P-type source contact region 156. Moreover, a doped concentration of the P-type source contact doped region 156 is higher than that of each of the P-type doped base regions 130, so that the resistance between each of the N-type source doped regions 138 and the source contact plug 158 can be decreased. The gate contact plug 160 penetrates through the second insulating layer 146 to be electrically connected to the P-type gate conductive layer 126. In addition, the contact plugs 162 penetrate through the second insulating layer 146 to be electrically connected to each of the N-type second doped regions 134 or each of the N-type third doped regions 136 respectively.

Figure 6:
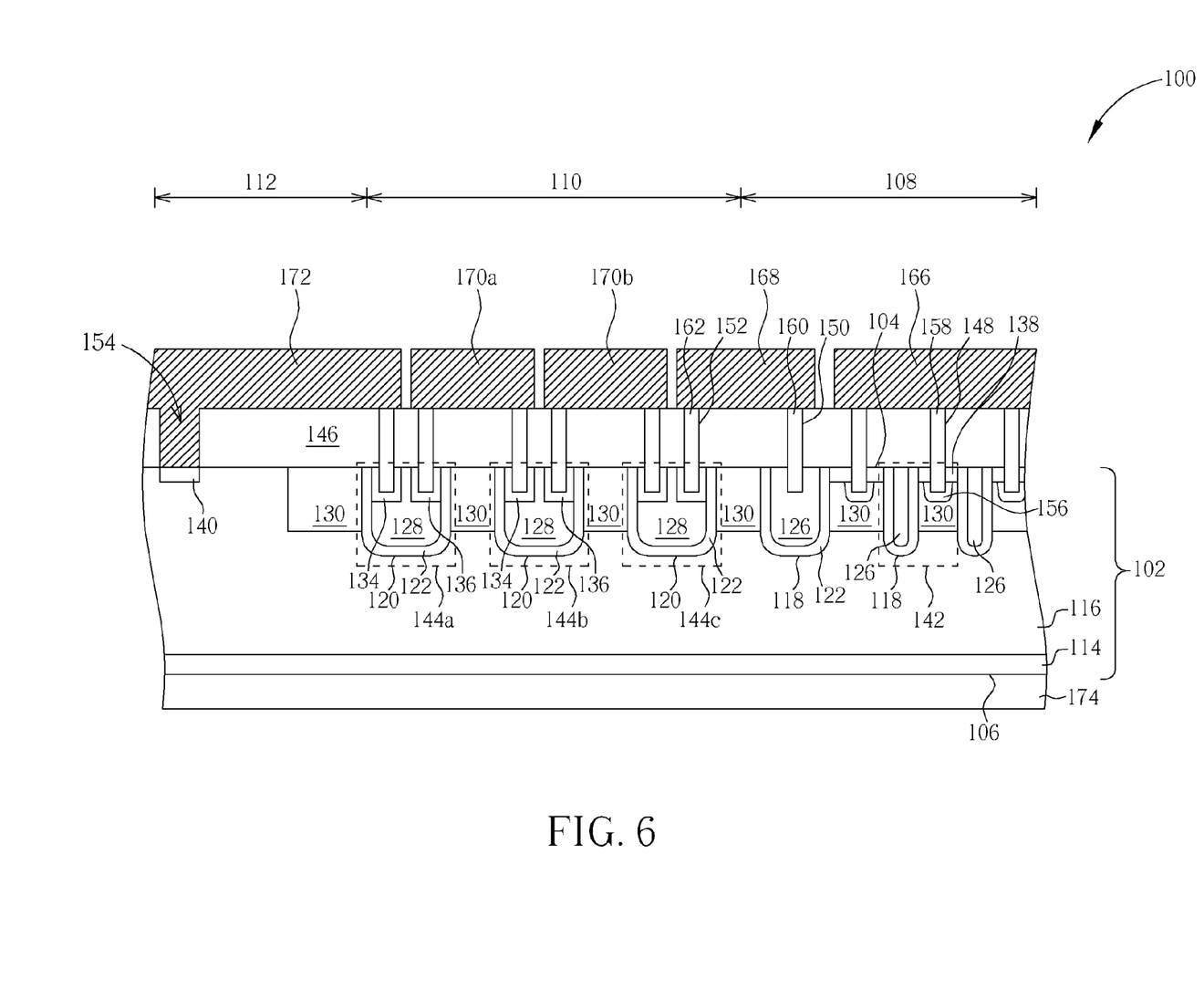

As shown in FIG. 6, a photolithography and etching process is performed with a fourth photomask to form a drain opening 154 in the second insulating layer 146 of the drain connection region 112 so that the N-type drain doped region 140 is exposed. Then, a photolithography and etching process is performed with a fifth photomask to form a source metal layer 166, a gate metal layer 168, two connection electrodes 170a, 170b, and a drain connection electrode 172 on the second insulating layer 146. The source metal layer 166 is electrically connected to the source contact plugs 158 to transmit the source signal to the N-type source doped regions 138. The gate metal layer 168 is electrically connected to the gate contact plug 160 to transmit the gate signal to the gate conductive layer 126, and the gate metal layer 168 is also electrically connected to the most approximate contact plug 162 for being electrically connected to the N-type third doped region 136 of the trench ESD protection device 144c. The drain connection electrode 172 is filled into the drain opening 154 for being connected to the drain doped region 140. The drain connection electrode 172 is electrically connected to the most approximate contact plug 162 for being electrically connected to the N-type second doped region 134 of the trench ESD protection device 144a and the N-type semiconductor substrate 102 regarded as the source of the NMOS transistor device 142. One of the connection electrodes 170a is electrically connected to the N-type third doped region 136 of the trench ESD protection device 144a and the N-type second doped region 134 of the trench ESD protection device 144b. The electrode 170b is electrically connected to the N-type third doped region 136 of the trench ESD protection device 144 band the N-type second doped region 134 of the trench ESD protection device 144c so that the trench ESD protection devices 144a, 144b, and 144c with bidirectional ESD protection can be serially connected between the gate and drain of the NMOS transistor device 142.

Afterward, a drain metal layer 174 is formed on the lower surface 106 of the N-type semiconductor substrate 102. A power semiconductor device with drain voltage protection 100 of the present invention is completed. The drain metal layer 174 is electrically connected to the N-type semiconductor substrate 102 to be electrically connected to the drain connection electrode 172 so that an end of the trench ESD protection devices 144a, 144b, 144c being serially connected to each other can be electrically connected to the drain of the NMOS transistor device 142. It is to be noted that since the drain metal layer 174 is formed on the lower surface 106 of the N-type semiconductor substrate 102, the sequence for forming the drain metal layer of the present invention is not limited to this. Alternatively, forming the drain metal layer 174 before or after performing the manufacturing process of the upper surface 104 of the N-type semiconductor substrate 102 is possible as well.

Therefore, the trench ESD protection devices are formed at the same time that the gate and source of the NMOS transistor device are formed so that the number of photomasks used in this embodiment is the same as the number of photomasks used for fabricating the conventional trench gate transistor device. As a result, an additional photomask to define the polysilicon layer in the conventional technique is not required, which leads to process simplification and cost reduction.

Moreover, the numbers of the first trench and the second trench are not limited to be plural. That is, the number of the trench ESD protection device is not limited to be plural. The semiconductor substrate of the present invention can have at least a first trench and at least a second trench, which is, when there is only a second trench, a power semiconductor device only includes a trench ESD protection device without the need of a connection electrode for a serial connection. Additionally, the number of the connection electrode is not limited to be two. The numbers of the second trench and the connection electrode can be determined according to the required number of the trench ESD protection device, which is the required capacity of ESD protection. Furthermore, the number of the first trench can be determined according to the required number of the trench gate transistor device.

Figure 7:
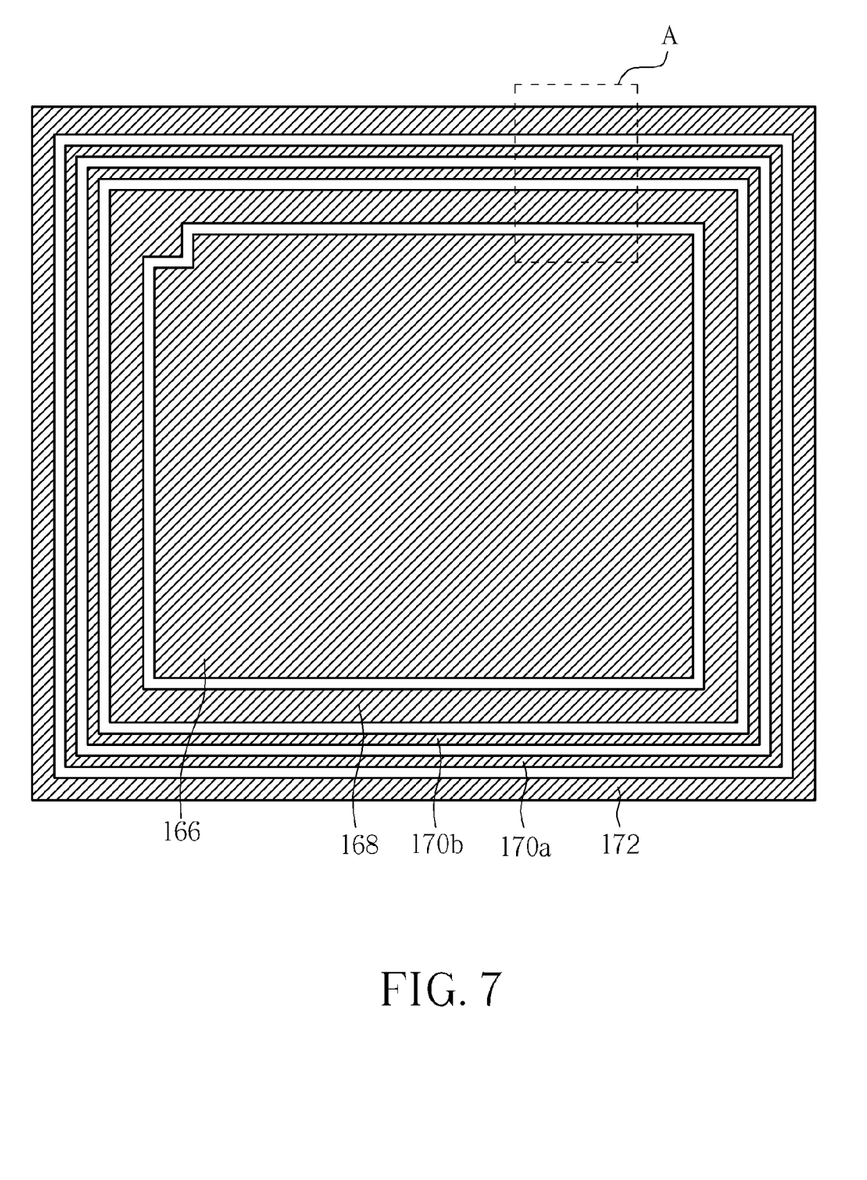
FIG. 7 is a top-view schematic diagram showing a power semiconductor device according to an example of a first embodiment of the present invention.
Figure 8:
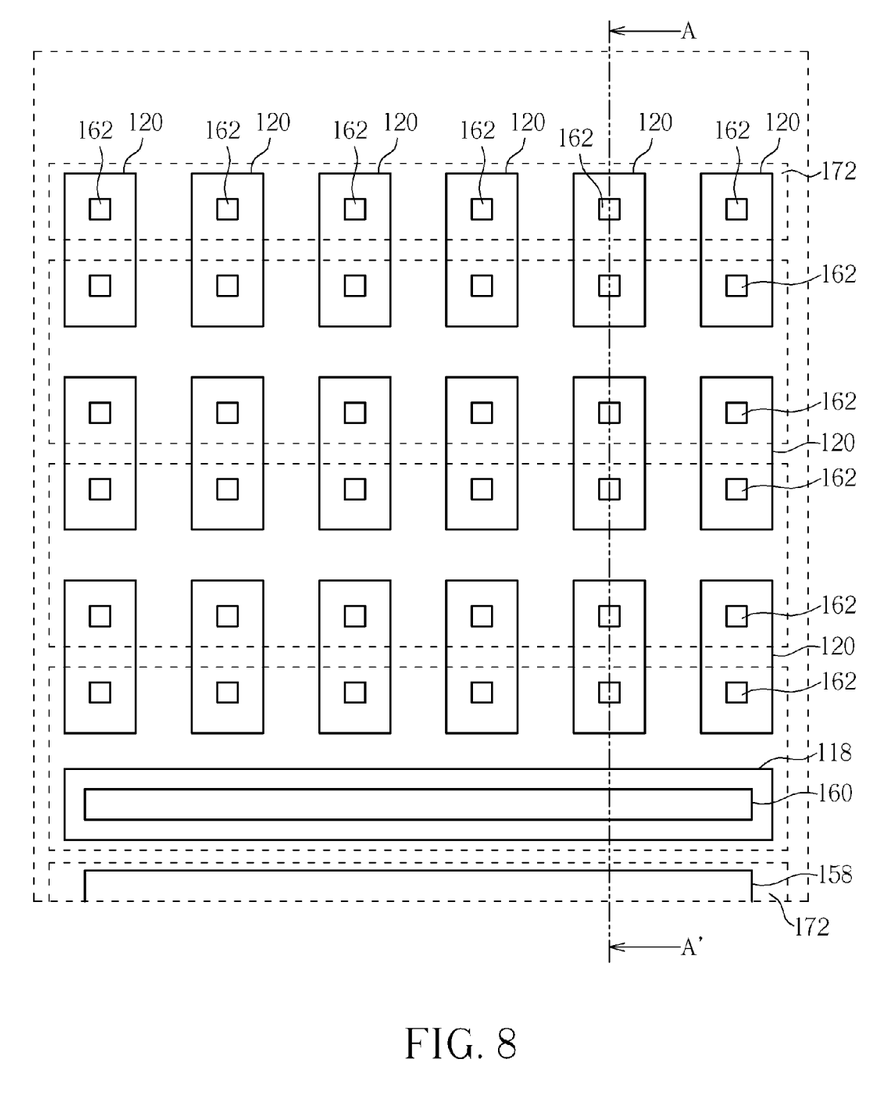
FIG. 8 is a top-view schematic diagram of area A of FIG. 7 showing the power semiconductor device according to the first embodiment of the present invention.

In addition, in order to clarify the structure of the power semiconductor device of its electrical connection of the present invention, refer to FIGS. 7 and 8 as well as FIG. 6. FIG. 7 is a top-view schematic diagram showing a power semiconductor device according to an example of a first embodiment of the present invention. FIG. 8 is a top-view schematic diagram of area A of FIG. 7 showing the power semiconductor device according to the first embodiment of the present invention. FIG. 6 is a cross-sectional schematic diagram showing the power semiconductor device along with line AA' of FIG. 8 according to the first embodiment of the present invention. As shown in FIG. 7, the drain connection electrode 172 encircles the gate metal layer 168, the source metal layer 166, and the connection electrodes 170a, 170b, and the connection electrodes 170a, 170b also encircles the gate metal layer 168 and the source metal layer 166 in this example. The gate metal layer 168 encircles the source metal layer 166. Additionally, the number of the connection electrodes 170a, 170b can depend upon the gate with different voltage resistances. As shown in FIGS. 6 and 8, the trench semiconductor device of this example includes a plurality of trench ESD protection devices 144a, 144b, and 144c. The trench ESD protection devices 144a are connected in parallel between the drain connection electrode 172 and the connection electrode 170a. The trench ESD protection devices 144b are connected between the connation electrodes 170a and 170b in parallel. The trench ESD protection devices 144c are connected between the connection electrode 170b and the gate metal layer 168 in parallel.

Figure 9:
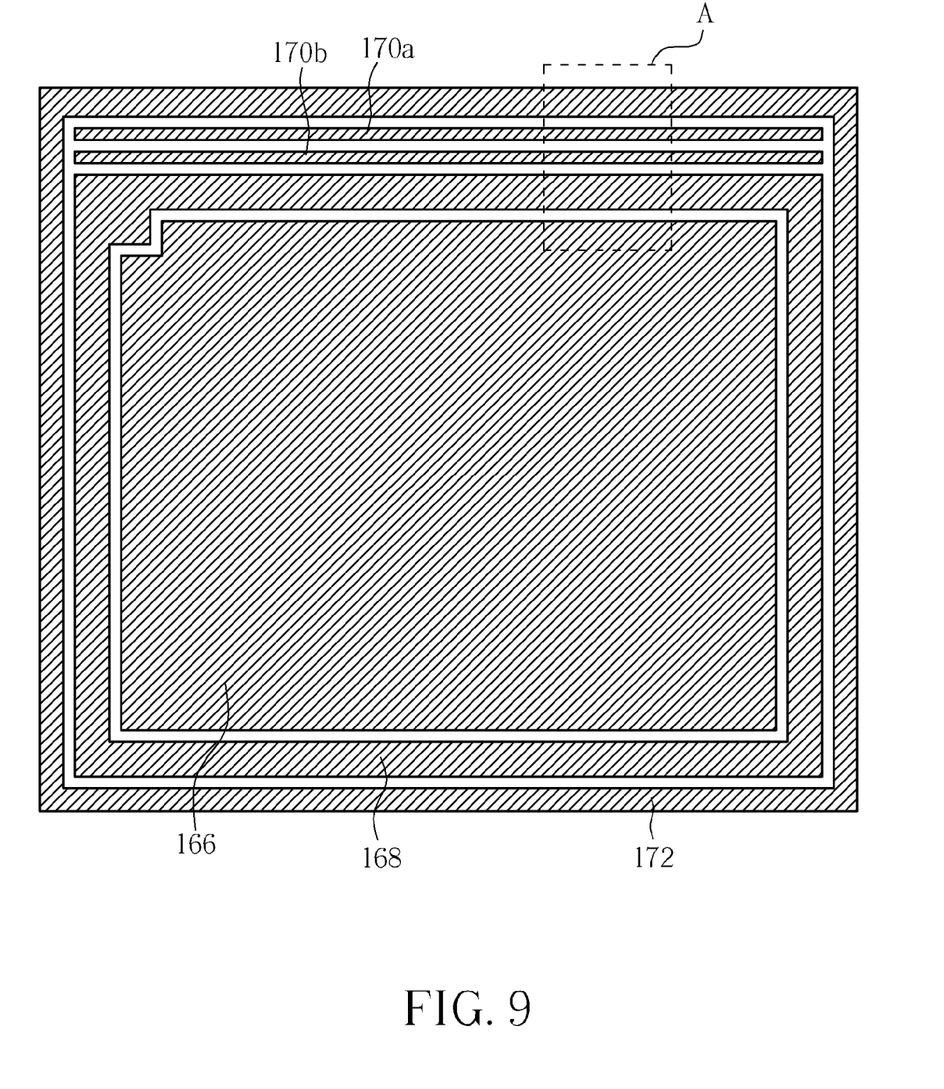
FIG. 9 is a top-view schematic diagram showing a power semiconductor device with drain voltage protection according to another example of the first embodiment of the present invention.

In the present invention, the layout of the connection electrodes of the power semiconductor device with drain voltage protection is not limited to the abovementioned example. FIG. 9 is a top-view schematic diagram showing a power semiconductor device with drain voltage protection according to another example of the first embodiment of the present invention. Referring to FIGS. 8 and 9, the connection electrodes 170a and 170b of this example are disposed between an outer side of the gate metal layer 168 and an inner side of the drain connection electrode 172. In the area A of FIG. 10, the cross-sectional diagram of the trench gate semiconductor device of this example also can be shown as FIG. 8.

Figure 10:
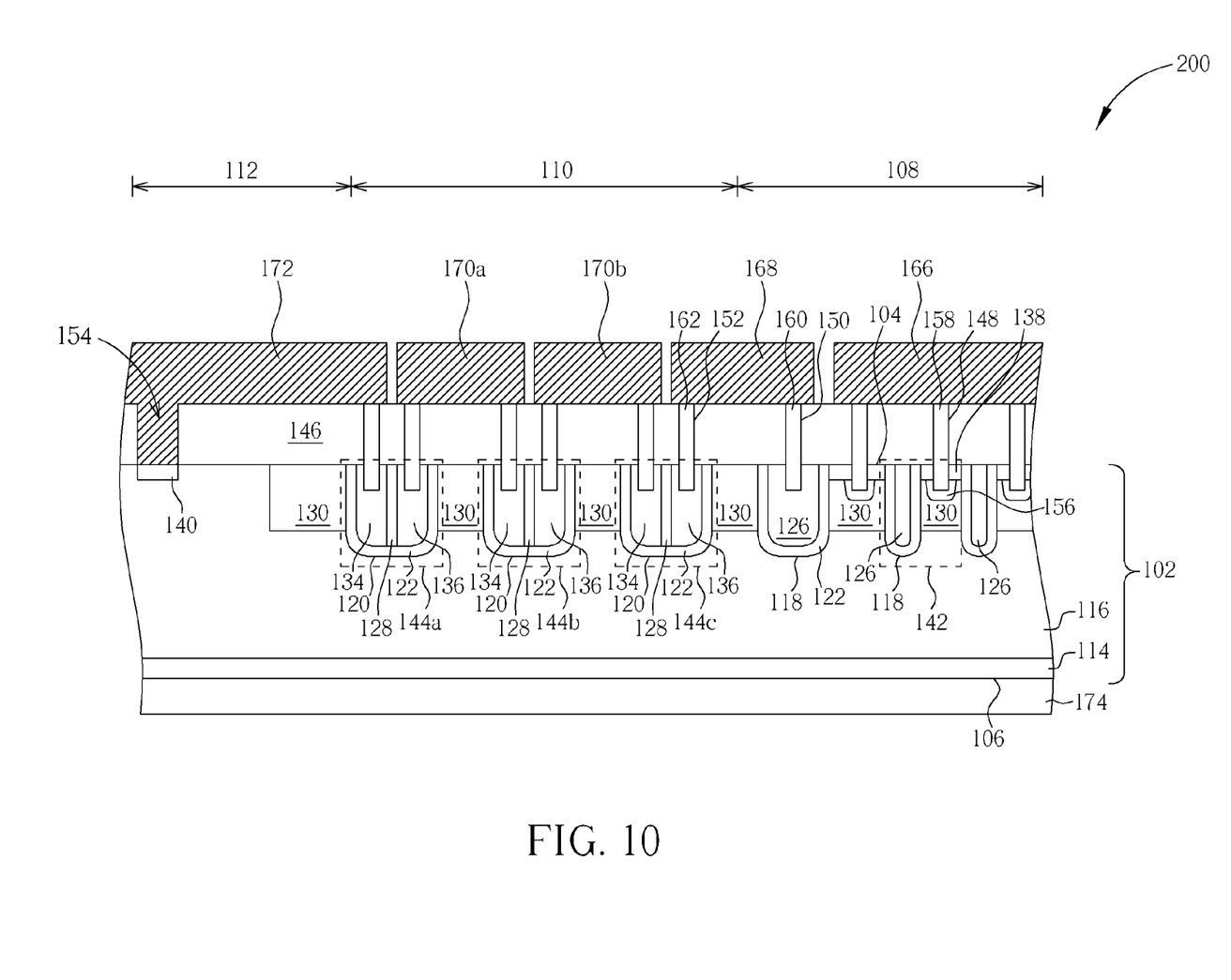
FIG. 10 is a cross-sectional schematic diagram showing a power semiconductor device with drain voltage protection according to a second embodiment of the present invention.

Furthermore, in the present invention, the second doped regions and the third doped regions in the power semiconductor device with drain voltage protection are not limited to be located on the first doped regions. FIG. 10 is a cross-sectional schematic diagram showing a power semiconductor device with drain voltage protection according to a second embodiment of the present invention. As shown in FIG. 10, as compared with the first embodiment, each of the second doped regions 134 and each of the third doped regions 136 of the power semiconductor device 200 in this embodiment extend to the bottom of the corresponding second trench 120, and are in contact with the corresponding first insulating layer 122 at the bottom of the corresponding second trench 120. Each of the first doped regions 128 is merely disposed between the corresponding second doped region 134 and the corresponding third doped region 136.

Figure 11:
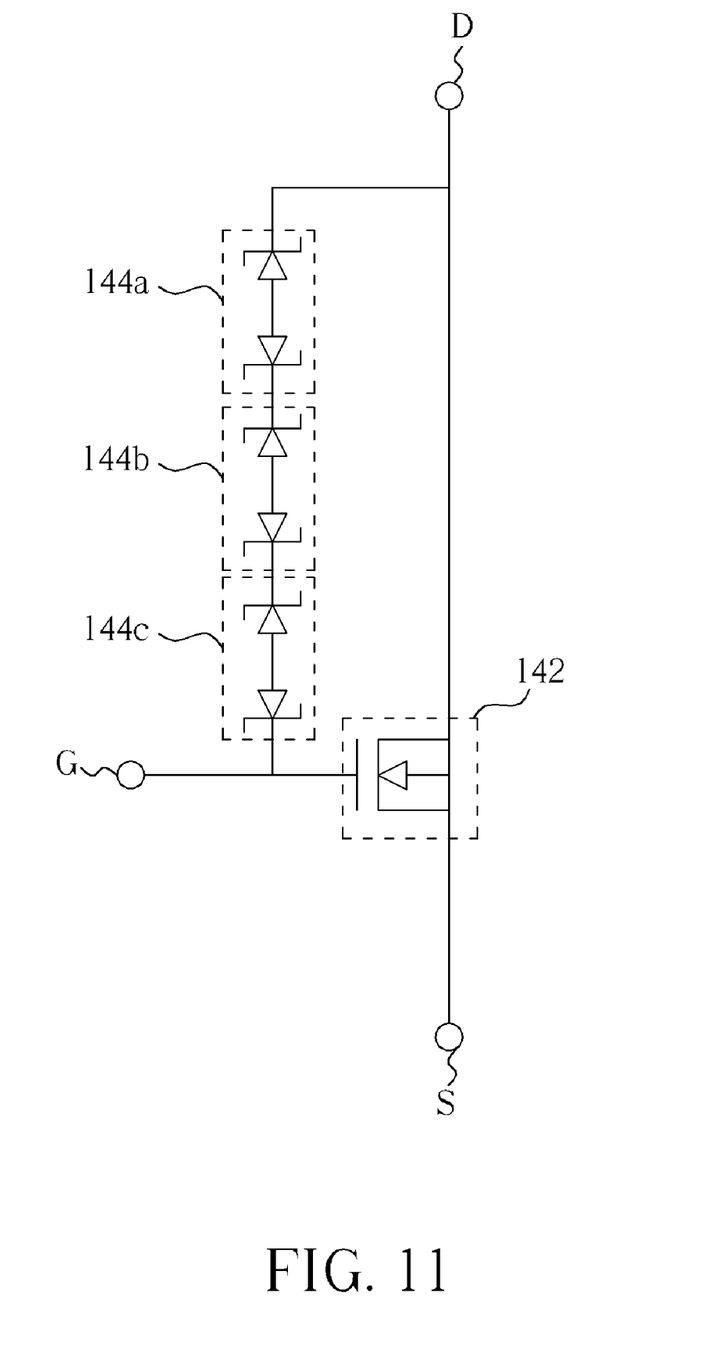
FIG. 11 is a circuit schematic diagram showing a power semiconductor device with drain voltage protection according to the present invention.

In order to clarify the circuit structure of the power semiconductor device with drain voltage protection in the present invention, refer to FIG. 11. FIG. 11 is a circuit schematic diagram showing the power semiconductor device with drain voltage protection according to the present invention. As shown in FIG. 11, in the power semiconductor device of the present invention, the trench ESD protection devices 144a, 144b, and 144c is electrically connected between the drain D and the gate G the trench gate transistor device 142 to. Due to that each of the trench ESD protection devices 144a, 144b, and 144c includes two bidirectional inconductive Zener diodes so that the power semiconductor device can provide an ESD protection ability with a specific voltage tolerance.

In summary, the manufacturing process of the trench ESD protection device is integrated into the manufacturing process of the trench gate transistor device in the present invention; therefore, additional masks to define doped region of the trench ESD protection device is no longer required. As a result, advantages of process simplification and cost reduction are able to be achieved. Furthermore, the present invention provides a power semiconductor device with drain voltage protection including a trench gate transistor device and a trench ESD protection device, and the trench ESD protection device is electrically connected between a source and a drain of the trench gate transistor device so as to provide a superior ability in ESD protection.

Those skilled in the art will readily observe that numerous modifications and alterations of the device and method may be made while retaining the teachings of the invention.

What is claimed is:

1. A power semiconductor device with drain voltage protection, comprising:
   a semiconductor substrate with a first conductive type, a first device region and a second device region being defined in the semiconductor substrate, a upper surface of the semiconductor substrate having at least a first trench and a second trench, wherein the first trench is disposed in the first device region, and the second trench is disposed in the second device region;
   at least a trench gate transistor device disposed in the first device region, wherein the trench gate transistor device comprises:
      a first insulating layer disposed on a surface of the first trench;
      a gate conductive layer disposed in the first trench;
      a doped base region with a second conductive type, the doped base region disposed in the semiconductor substrate at a side of the first trench; and a source doped region with the first conductive type, the source doped region disposed in the doped base region of the first device region;

a source metal layer disposed on the upper surface of the semiconductor substrate and electrically connected to the source doped region;

a gate metal layer disposed on the upper surface of the semiconductor substrate and electrically connected to the gate conductive layer;

a drain metal layer disposed on a lower surface of the semiconductor substrate; and at least a trench ESD protection device disposed in the second trench of the second device region, the trench ESD protection device comprising a first doped region, a second doped region, and a third doped region, and the first doped region, the second doped region and the third doped region being disposed in a same semiconductor layer, wherein the first doped region is disposed between the second doped region and the third doped region, the second doped region is electrically connected to the drain metal layer, and the third doped region is electrically connected to the gate metal layer.

2. The power semiconductor device of claim 1, further comprising a drain connection electrode disposed on the upper surface of the semiconductor substrate, wherein the trench ESD protection device is electrically connected to the drain metal layer via the drain connection electrode.

3. The power semiconductor device of claim 2, wherein the drain connection electrode encircles the gate metal layer and the source metal layer, and the gate metal layer encircles the source metal layer.

4. The power semiconductor device of claim 2, further comprising at least another second trench, at least another trench ESD protection device disposed in the other second trench and at least a connection electrode, the connection electrode disposed on the upper surface of the semiconductor substrate, wherein the trench ESD protection devices are electrically connected in series between the gate metal layer and the drain connection electrode.

5. The power semiconductor device of claim 4, wherein the connection electrode is disposed between the drain connection electrode and the gate metal layer.

6. The power semiconductor device of claim 5, wherein the drain connection electrode encircles the connection electrode and the connection electrode encircles the gate metal layer.

7. The power semiconductor device of claim 4, wherein the connection electrode is electrically connected to the third doped region of the trench ESD protection device and a second doped region of the other trench ESD protection device, and a third doped region of the other trench ESD protection device is electrically connected to the gate metal layer.

8. The power semiconductor device of claim 2, further comprising a drain doped region with the first conductive type, the drain doped region being disposed on the upper surface of the semiconductor substrate and being directly in contact with the drain connection electrode.

9. The power semiconductor device of claim 1, wherein the first conductive type is an N type and the second conductive type is a P type.

10. The power semiconductor device of claim 1, wherein the second doped region and the third doped region are not in contact with a bottom surface of the second trench.

11. The power semiconductor device of claim 1, further comprising at least two contact plugs, electrically connecting the second doped region to the drain metal layer and electrically connecting the third doped region to the gate metal layer respectively, and a bottom surface of each contact plug is lower than a top surface of the second doped region and a top surface of the third doped region.

* * * * *